United States Patent
Nguyen et al.

(10) Patent No.: US 8,338,536 B2
(45) Date of Patent: Dec. 25, 2012

(54) ADHESIVE COMPOSITIONS FOR USE IN DIE ATTACH APPLICATIONS

(75) Inventors: My Nguyen, Poway, CA (US); Tadashi Takano, Huntington Beach, CA (US); Puwei Liu, San Marcos, CA (US)

(73) Assignee: Henkel Corporation, Rocky Hill, CT (US)

( * ) Notice: Subject to any disclaimer, the term of this patent is extended or adjusted under 35 U.S.C. 154(b) by 0 days.

(21) Appl. No.: 12/884,300

(22) Filed: Sep. 17, 2010

(65) Prior Publication Data
US 2011/0070436 A1 Mar. 24, 2011

Related U.S. Application Data

(63) Continuation of application No. PCT/US2009/037246, filed on Mar. 16, 2009.

(60) Provisional application No. 61/037,096, filed on Mar. 17, 2008.

(51) Int. Cl.
*C08L 63/00* (2006.01)
*C08L 63/02* (2006.01)
*C08L 63/06* (2006.01)
*B32B 27/38* (2006.01)
*C09J 163/00* (2006.01)
*C09J 163/02* (2006.01)
*C09J 163/06* (2006.01)

(52) U.S. Cl. ...... 525/92 H; 156/329; 156/330; 428/413; 525/525; 525/526; 525/529; 525/531

(58) Field of Classification Search .................. None
See application file for complete search history.

(56) References Cited

U.S. PATENT DOCUMENTS

| | | | |
|---|---|---|---|
| 5,037,885 A * | 8/1991 | Mori et al. ...................... 525/65 |
| 5,140,404 A | 8/1992 | Fogal et al. |
| 5,173,544 A * | 12/1992 | Shimizu et al. ............... 525/476 |
| 5,286,679 A | 2/1994 | Farnworth et al. |
| 5,323,060 A | 6/1994 | Fogal et al. |
| 5,447,988 A | 9/1995 | Dershem et al. |
| 6,034,194 A | 3/2000 | Dershem et al. |
| 6,211,320 B1 | 4/2001 | Dershem et al. |
| 6,387,990 B1 | 5/2002 | Yeager |
| 6,465,893 B1 | 10/2002 | Khandros et al. |
| 6,521,731 B2 | 2/2003 | Dershem et al. |
| 6,613,839 B1 * | 9/2003 | Gan et al. ...................... 525/117 |
| 7,162,110 B2 | 1/2007 | Kohinata et al. |
| 7,176,044 B2 * | 2/2007 | Forray et al. .................... 438/15 |
| 7,312,534 B2 | 12/2007 | delos Santos et al. |
| 7,691,475 B2 * | 4/2010 | Larson et al. ........... 428/355 BL |
| 7,926,697 B2 * | 4/2011 | Shekhawat et al. ...... 228/180.22 |
| 2002/0086239 A1 | 7/2002 | Chen et al. |
| 2003/0118835 A1 * | 6/2003 | Jayaraman et al. ........... 428/414 |
| 2007/0282081 A1 | 12/2007 | Ichiroku |

FOREIGN PATENT DOCUMENTS

| | | |
|---|---|---|
| JP | 8-169935 A * | 7/1996 |
| JP | 2004-189815 | 7/2004 |
| JP | 2005-232384 A * | 9/2005 |
| JP | 2006-291098 | 10/2006 |
| JP | 2008-244351 | 10/2008 |
| WO | WO 2006-090794 | 8/2006 |
| WO | WO 2007-075769 | 7/2007 |

OTHER PUBLICATIONS

International Search Report issued in connection with International Patent Application No. PCT/US2009/037246 mailed Mar. 2, 2010.

* cited by examiner

*Primary Examiner* — Robert Sellers
(74) *Attorney, Agent, or Firm* — Steven C. Bauman

(57) ABSTRACT

Novel adhesive compositions that can be used in the die attach process. The adhesives include a curable resin component, a curing agent, and a block copolymer additive. The block copolymer additive has a glass transition temperature of at least about 40° C. The block copolymer additive improves the affinity of the adhesive composition to a hydrophilic substrate, such as a silicon wafer, during the die pickup process. Also disclosed is an assembly which includes a hydrophilic substrate and a layer of adhesive and methods of producing the assembly.

10 Claims, 4 Drawing Sheets

ADHESIVE COMPOSITIONS FOR USE IN DIE ATTACH APPLICATIONS

BACKGROUND

1. Field

Adhesive compositions are provided and more specifically adhesive compositions useful in the die attach process. The adhesive compositions exhibit excellent adhesive film release and die attach properties while also exhibiting void-free coverage in die attach applications.

2. Related Technology

Adhesive compositions play a prominent role in many industrial applications. For example, in the electronics industry, packaging engineers faced with increased challenges of finding new and better ways of creating and attaching dies during the dicing and subsequent die placement processes often rely on adhesive compositions to secure a silicon wafer to a dicing substrate during the dicing process and also to secure the individual diced chips to a circuit board or other substrate during die placement. Numerous adhesive compositions have been proposed for use in such die attach processes, including those described in one or more of U.S. Pat. No. 7,162,110 (Kohinata et al.), U.S. Pat. No. 7,312,534 (Santos et al.), and U.S. Pat. No. 7,176,044 (Forray et al.).

Those adhesives generally include a curable base component and one or more additives that provide the composition with unique properties. For example, additives are known to improve conductivity, reduce cure time, and provide a stronger interface bond after die placement has occurred. However, these adhesives do not adequately address certain problems associated with some of the current operations in the die attach industry.

For example, dicing die attach films, which are composed of a dicing tape layer and an adhesive layer on top of the tape layer, are increasingly being used in the dicing and die attach process. In use, a pre-diced silicon wafer is placed onto the adhesive layer of such a film, dicing of the wafer and the adhesive layer is completed, and the individual chip dies are removed from the tape layer of the film using conventional die pickup methods. Ideally, the layer of adhesive, which is also diced during the dicing process, transfers from the dicing tape to the chip die so that the chip die can subsequently be placed directly at another location without first dispensing a new layer of adhesive on the chip die or at the new placement location.

However, because of the nature of the adhesives currently used to form the adhesive layer in these dicing die attach films, adequate transfer of the adhesive from the dicing tape layer to the chip die surface does not always occur. Furthermore, because the adhesives used in the adhesive layer are composed of high molecular weight resins, the flow properties of such adhesives are oftentimes insufficient to create a void-free bond interface between the chip die and the substrate after the subsequent die placement and curing steps for die attachment.

Thus, there remains a need for novel adhesive compositions which include additives that provide unique advantages over those adhesive compositions that are currently known, particularly adhesives that better facilitate the transfer of the adhesive layer to the die during the die pickup process and allow for the formation a void-free bond after die placement.

SUMMARY

In one aspect an adhesive composition is provided, and in particular an adhesive composition that includes a curable resin component, a curing agent, and a block copolymer additive that is comprised of hydrophilic and hydrophobic segments where the additive has a glass transition temperature of at least about 40° C., such as between about 60 and 150° C.

In one embodiment, the ratio of the hydrophobic segments to the hydrophilic segments in the block copolymer additive is at least 2:1 and in another embodiment this ratio is between 3:1 and 12:1.

In another aspect, the hydrophilic segments contain O or N atoms, and in one embodiment the hydrophilic segment is an anhydride, such as maleic anhydride.

In yet another embodiment, the hydrophobic segments include at least one polyolefin, examples of which include ethylene, propylene, 1-butene, 1-hexene, 3-methyl-1-pentene, 4-methyl-1-pentene, and styrene.

In another aspect, an assembly comprised of a hydrophilic substrate, which may be a silicon wafer, and an adhesive composition is provided. The adhesive composition includes a curable resin component, a curing agent, and a block copolymer additive that is comprised of hydrophilic and hydrophobic segments in a ratio of at least 2 hydrophobic segments to every 1 hydrophilic segment.

In another aspect, a method of forming an assembly comprising a hydrophilic substrate and an adhesive composition that includes a curable resin component, a curing agent, and a block copolymer additive that is comprised of hydrophilic and hydrophobic segments in a ratio of at least 2 hydrophobic segments to every 1 hydrophilic segment is provided.

In another aspect, a composition including:
An epoxy component;
A silane-modified epoxy component;
A thermoplastic urethane; and
Diaminodiphenyl sulfone,
is provided, which may be in the form of a pre-applied adhesive.

In another aspect, a composition of matter is provided that includes:
As component (A) an epoxy component embraced by the following structure:

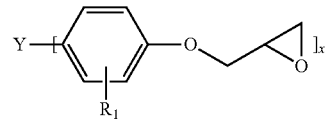

where Y may or may not be present and when Y present is a direct bond, $CH_2$, $CH(CH_3)_2$, $C=O$, or S, $R_1$ here is alkyl, alkenyl, hydroxy, carboxy and halogen, and x here is 1-4;

As component (B) an epoxy-functionalized alkoxy silane embraced by the following structure:

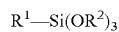 (VIII)

where $R^1$ is an oxirane-containing moiety and $R^2$ is an alkyl or alkoxy-substituted alkyl, aryl, or aralkyl group having from one to ten carbon atoms; and As component (C) reaction products of components (A) and (B) is provided.

DETAILED DESCRIPTION

Figure 1:
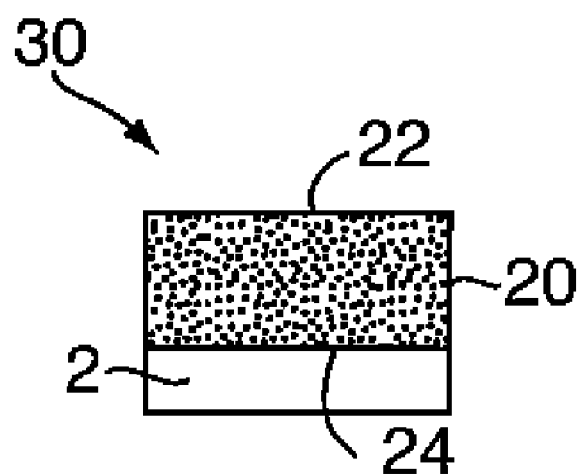
FIG. 1 is a schematic representation of an assembly.

As used herein, spatial or directional terms, such as "left", "right", "inner", "outer", "above", "below", "top", "bottom", and the like, relate to the invention as it is shown in FIG. 1. However, it is to be understood that the invention may assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims are approximations that may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to include the beginning and ending range values and to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 5.5 to 10.

A composition of matter and, in one particular embodiment, an adhesive composition, such as for use in die attach applications is provided. The adhesive composition includes a curable resin component, a curing agent, and a block copolymer additive comprised of hydrophilic and hydrophobic segments. The block copolymer additive of the present invention acts as a "release agent" by increasing the affinity of the adhesive composition for a hydrophilic substrate, such as a hydrophilic silicon wafer, compared to a hydrophobic substrate, such as a hydrophobic polyolefin dicing tape. This effect makes the adhesive composition of the instant invention particularly desirable for use in the die attach industry. For instance, if the adhesive composition of the present invention is used to secure a hydrophilic pre-diced wafer to a hydrophobic dicing tape during dicing, the adhesive layer will transfer, or release, from the dicing tape to the surface of the chip dies upon removal of the individual dies from the dicing tape. This allows for immediate attachment of the chip dies onto another substrate and eliminates the need for subsequent dispensing of additional adhesive layers prior to such attachment.

For purposes of this application, a hydrophilic segment is defined as a moiety of a polymer that can be generally described as charge polarized, or polar, and capable of hydrogen bonding with, for example, water molecules. When used in describing a substrate, a hydrophilic substrate is one that is wettable upon contact with a polar liquid, such as water. A hydrophobic segment is a polymer moiety that is non-polar, or charge neutral, and typically incapable of fully dissolving in polar solvents.

As noted, the adhesive composition of the present invention includes a curable resin component. The curable resin component can be any curable resin, and is desirably a thermosetting polymeric material that cures through the addition of energy, such as heat or irradiation, to a stronger form. Particularly useful are thermosetting resins that are capable of undergoing a partial cure, such as through a B-staging process, to form a partial reaction product, in a tackified form. Examples of useful curable resins include epoxies, episulfides, maleimides, itaconimides, nadimides, (meth)acrylates, and combinations thereof.

If the resin component is selected to include an epoxy, any thermosetting epoxy resin may be used which is capable of being partially cured or B-staged, as will be discussed in more detail herein. Particularly desirable are solid epoxy resins and, in particular, tri- or multi-functional epoxy resins. Non-limiting examples of useful epoxy resins include solid epoxy resins derived from bisphenol A, F, or S, tetramethyl and/or biphenyl, and epichlorohydrin, novalacs, and the like. Triglycidyl isocyanurate ("TGIC") is particularly desirable, a commercially available example of which is tris(2,3-epoxypropyl) isocyanurate, sold under the tradename TEPIC® by Nissan Chemical Industries, Ltd. Also desirable is a dicyclopentadiene ("DCPD") epoxy, an example of which is Tactix® 556 from Huntsman Chemical. Combinations of epoxy resins can also be used.

Examples of other useful epoxies include those embraced by structures I and II below.

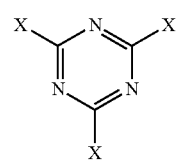
(I)

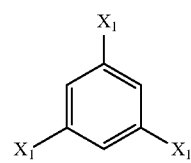
(II)

In structures I and II, X can be present at least once on structure I (i.e., mono-, di-, or tri-substituted) and itself may be chosen from H or $D_nA$, where n can range between 0 and 1, with at least one X being $D_nA$. D, if present (i.e., if n=1), can be attached to the ring and can be chosen from O, S, or NH. A can be attached to D (if present) or directly to the ring (if D is not present, i.e., n=0). A can be represented by structure III below:

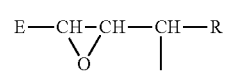
(III)

where E can be a member selected from H, alkyl, alkenyl, alkynyl, and/or alkoxy groups which may be linear, branched, or cyclic, and/or aryl groups, having from 1 to 20 carbon atoms with or without substitution by halogen, silicon, hydroxy, nitrile, ester, amide, or sulfate. R can be selected from H, alkyl, alkenyl, alkynyl, and/or alkoxy groups which may be linear, branched, or cyclic, and aryl groups, having from 1 to about 20 carbon atoms, with or without substitution by halogen, nitrogen, silicon, hydroxy, nitrile, ester, amide, or sulfate.

$X_1$ can be present at least once on structure II (i.e., mono-, di-, or tri-substituted) and itself may be chosen from H or $O=CD_nA$ with at least one $X_1$ being $O=CD_nA$, where $D_n$ and A can be as defined above.

Another suitable epoxy is embraced by

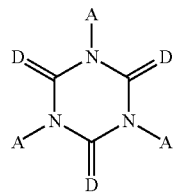

(IV)

where D and A can be as described above and can be present at least once and can also be present together attached to ring atoms which are in alpha-beta relation to one another.

Examples of particular epoxies thus include, but are not limited to, those embraced in formulas V-VII below.

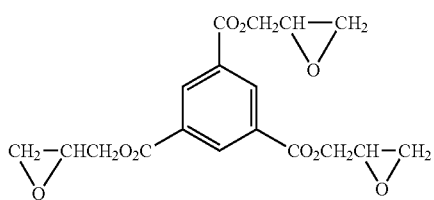

(V)

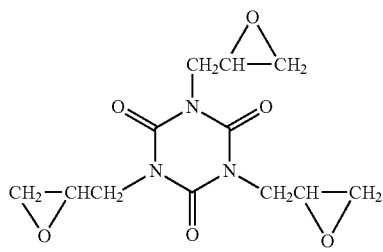

(VII)

Also particularly desirable are silane-modified epoxies. One such silane-modified epoxy is formed as the reaction product of an aromatic epoxy, such as a bisphenol A, E, F or S epoxy or biphenyl epoxy, and epoxy silane where the epoxy silane is embraced by structure VIII:

(VIII)

where $R^1$ is an oxirane-containing moiety, examples of which include 2-(ethoxymethyl)oxirane, 2-(propoxymethyl)oxirane, 2-(methoxymethyl)oxirane, and 2-(3-methoxypropyl) oxirane and $R^2$ is an alkyl or alkoxy-substituted alkyl, aryl, or aralkyl group having from one to ten carbon atoms. In one embodiment, $R^1$ is 2-(ethoxymethyl)oxirane and $R^2$ is methyl.

Idealized structures of the aromatic epoxy used to prepare the silane modified epoxy include

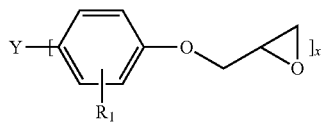

where Y may or may not be present and when Y present is a direct bond, $CH_2$, $CH(CH_3)_2$, $C=O$, or S, $R_1$ here is alkyl, alkenyl, hydroxy, carboxy and halogen, and x here is 1-4. Of course, when x is 2-4, chain extended versions of the aromatic epoxy are also contemplated as being embraced by this structure.

For instance, a chain extended version of the aromatic epoxy may be embraced by the structure below

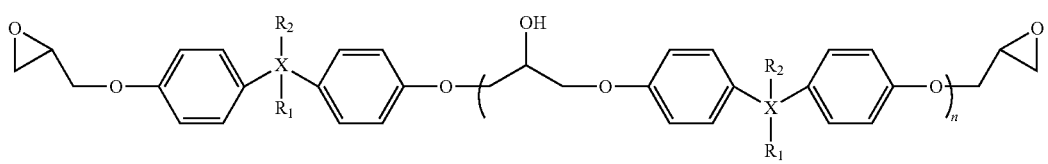

The silane modified epoxy may also be a combination of the aromatic epoxy, the epoxy silane, and reaction products of the aromatic epoxy and the epoxy silane. The reaction products may be prepared from the aromatic epoxy and epoxy silane in a by weight ratio of 1:100 to 100:1, such as a by weight ratio of 1:10 to 10:1.

In addition to epoxies, episulfides are desirable as well, whether they are full or partial episulfides, provided that they are in the solid state. Episulfides may be commercially available or readily prepared from the corresponding epoxy through known synthetic methods.

Maleimides, nadimides, and itaconimides are also useful as the curable resin, including those compounds having the following structures IX, X, and XI, respectively:

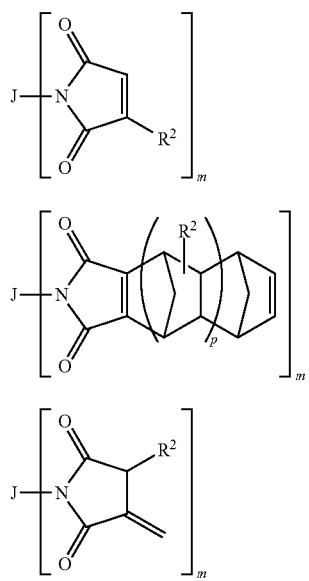

where m can range from 1 to 15, p can range from 0 to 15, each $R^2$ is independently selected from hydrogen or lower alkyl, and J is a monovalent or a polyvalent moiety comprising organic or organosiloxane radicals, and combinations of two or more thereof.

More specific representations of the maleimides, itaconimides, and nadimides in the solid state include those corresponding to structures IX, X, or XI, where m ranges from 1 to 6, p is 0, $R^2$ is independently selected from hydrogen or lower alkyl, and J is a monovalent or polyvalent radical selected from hydrocarbyl, substituted hydrocarbyl, heteroatom-containing hydrocarbyl, substituted heteroatom-containing hydrocarbyl, hydrocarbylene, substituted hydrocarbylene, heteroatom-containing hydrocarbylene, substituted heteroatom-containing hydrocarbylene, polysiloxane, polysiloxane-polyurethane block copolymer, and combinations of two or more thereof, optionally containing one or more linkers selected from a covalent bond, —O—, —S—, —NR—, —O—C(O)—, —O—C(O)—O—, —O—C(O)—NR—, —NR—C(O)—, —NR—C(O)—O—, —NR—C(O)—NR—, —S—C(O)—, —S—C(O)—O—, —S—C(O)—NR—, —S(O)—, —S(O)$_2$—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O) NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$O—, —S—P(O)R$_2$—, —NR—P(O)R$_2$—, where each R is independently hydrogen, alkyl or substituted alkyl, and combinations of any two or more thereof.

When one or more of the above described monovalent or polyvalent groups contain one or more of the above described linkers to form the "J" appendage of a maleimide, nadimide, or itaconimide group, as readily recognized by those of skill in the art, a wide variety of linkers can be produced, such as, for example, oxyalkyl, thioalkyl, aminoalkyl, carboxylalkyl, oxyalkenyl, thioalkenyl, aminoalkenyl, carboxyalkenyl, oxyalkynyl, thioalkynyl, aminoalkynyl, carboxyalkynyl, oxycycloalkyl, thiocycloalkyl, aminocycloalkyl, carboxycycloalkyl, oxycloalkenyl, thiocycloalkenyl, aminocycloalkenyl, carboxycycloalkenyl, heterocyclic, oxyheterocyclic, thioheterocyclic, aminoheterocyclic, carboxyheterocyclic, oxyaryl, thioaryl, aminoaryl, carboxyaryl, heteroaryl, oxyheteroaryl, thioheteroaryl, aminoheteroaryl, carboxyheteroaryl, oxyalkylaryl, thioalkylaryl, aminoalkylaryl, carboxyalkylaryl, oxyarylalkyl, thioarylalkyl, aminoarylalkyl, carboxyarylalkyl, oxyarylalkenyl, thioarylalkenyl, aminoarylalkenyl, carboxyarylalkenyl, oxyalkenylaryl, thioalkenylaryl, aminoalkenylaryl, carboxyalkenylaryl, oxyarylalkynyl, thioarylalkynyl, aminoarylalkynyl, carboxyarylalkynyl, oxyalkynylaryl, thioalkynylaryl, aminoalkynylaryl or carboxyalkynylaryl, oxyalkylene, thioalkylene, aminoalkylene, carboxyalkylene, oxyalkenylene, thioalkenylene, aminoalkenylene, carboxyalkenylene, oxyalkynylene, thioalkynylene, aminoalkynylene, carboxyalkynylene, oxycycloalkylene, thiocycloalkylene, aminocycloalkylene, carboxycycloalkylene, oxycycloalkenylene, thiocycloalkenylene, aminocycloalkenylene, carboxycycloalkenylene, oxyarylene, thioarylene, aminoarylene, carboxyarylene, oxyalkylarylene, thioalkylarylene, aminoalkylarylene, carboxyalkylarylene, oxyarylalkylene, thioarylalkylene, aminoarylalkylene, carboxyarylalkylene, oxyarylalkenylene, thioarylalkenylene, aminoarylalkenylene, carboxyarylalkenylene, oxyalkenylarylene, thioalkenylarylene, aminoalkenylarylene, carboxyalkenylarylene, oxyarylalkynylene, thioarylalkynylene, aminoarylalkynylene, carboxy arylalkynylene, oxyalkynylarylene, thioalkynylarylene, aminoalkynylarylene, carboxyalkynylarylene, heteroarylene, oxyheteroarylene, thioheteroarylene, aminoheteroarylene, carboxyheteroarylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, carboxyheteroatom-containing di- or polyvalent cyclic moiety, disulfide, sulfonamide, and the like.

In another embodiment, maleimides, nadimides, and itaconimides contemplated for use in the practice of the present invention have the structures IX, X, or XI, where m ranges from 1 to 6, p ranges between 0 and 6, and J is selected from: saturated straight chain alkyl or branched chain alkyl, optionally containing optionally substituted aryl moieties as substituents on the alkyl chain or as part of the backbone of the alkyl chain, and where the alkyl chains have up to about 20 carbon atoms; a siloxane having the structure $-(C(R^3)_2)_d-[Si(R^4)_2-O]_f-Si(R^4)_2-(C(R^3)_2)_e-$, $-(C(R^3)_2)_dC(R^3)-C(O)O-(C(R^3)_2)_d-[Si(R^4)_2-O]_f-Si(R^4)_2-(C(R^3)_2)_e-O(O)C-(C(R^3)_2)_e-$, or $-(C(R^3)_2)_d-C(R^3)-O(O)C-(C(R^3)_2)_d-[Si(R^4)_2-]_2-(C(R^3)_2)_e-C(O)O-(C(R^3)_2)_e-$, where each $R^3$ is independently hydrogen, alkyl or substituted alkyl, each $R^4$ is independently hydrogen, lower alkyl or aryl, d ranges from 1 to 10, e ranges between 1 and 10, and f ranges from 1 to 50; a polyalkylene oxide having the structure:

$$[(CR_2)_r-O-]_f-(CR_2)_s- \quad (XII)$$

where each R is independently hydrogen, alkyl or substituted alkyl, r is between 1 and 10, s is between 1 and 10, and f ranges from 1 to 50; aromatic groups having the structure:

(XIII)

where each Ar is a monosubstituted, disubstituted, or trisubstituted aromatic or heteroaromatic ring having in the range of 3 up to 10 carbon atoms, and Z is saturated straight chain alkylene or branched chain alkylene, optionally containing saturated cyclic moieties as substituents on the alkylene chain or as part of the backbone of the alkylene chain; polyalkylene oxides having the structure:

$$[(CR_2)_r-O-]_q-(CR_2)_3- \quad (XIV)$$

where each R is independently hydrogen, alkyl or substituted alkyl, r is between 1 and 10, s is between 1 and 10, and q falls in the range of 1 up to 50; di- or tri-substituted aromatic moieties having the structure:

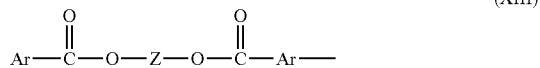
(XV)

where each R is independently hydrogen, alkyl, or substituted alkyl, t falls in the range of 2 up to 10, u falls in the range of 2 up to 10, and Ar is a monosubstituted, disubstituted, or trisubstituted aromatic or heteroaromatic ring having in the range of 3 up to 10 carbon atoms; aromatic groups having the structures:

(XVI)

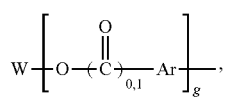
(XVII)

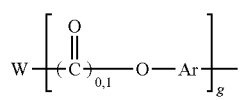
(XVIII)

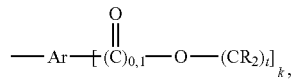
(XIX)

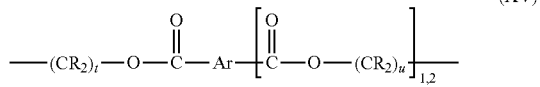
(XX)

(XXI)

where each R is independently hydrogen, alkyl, or substituted alkyl, t is from 2 to 10, k is 1, 2, or 3, g ranges from 1 up to about 50, each Ar is as defined above, E is $-O-$ or $-NR^5-$ where $R^5$ is hydrogen or lower alkyl, and W is straight or branched chain alkyl, alkylene, oxyalkylene, ester, or polyester, a siloxane having the structure $-(C(R^3)_2)_d-[Si(R^4)_2-O]_f-Si(R^4)_2-(C(R^3)_2)_e-$, $-(C(R^3)_2)_dC(R^3)-C(O)O-(C(R^3)_2)_d-[Si(R^4)_2-O]_f-Si(R^4)_2-(C(R^3)_2)_e-(O)C-(C(R^3)_2)_e-$, or $-(C(R^3)_2)_d-C(R^3)-O(O)-(C(R^3)_2)_d-[Si(R^4)_2-O]_f-Si(R^4)_2-(C(R^3)_2)_e-C(O)O-(C(R^3)_2)_e-$, where each $R^3$ is independently hydrogen, alkyl, or substituted alkyl, each $R^4$ is independently hydrogen, lower alkyl, or substituted aryl, d and e are each from 1 to 10, and f is from 1 to 50; a polyalkylene oxide having the structure:

$$-[(CR_2)_r-O-]_f-(CR_2)_s- \quad (XXII)$$

where each R is independently hydrogen, alkyl, or substituted alkyl, r and s each range from 1 to 10, and f is from 1 to 50, optionally containing substituents selected from hydroxy, alkoxy, carboxy, nitrile, cycloalkyl, or cycloalkenyl; a urethane group having the structure:

$$R^7U-C(O)-NR^6-R^8-NR^6-C(O)-(O-R^8-O-C(O)NR^6-R^8-NR^6-C(O))_v-U-R^8- \quad (XXIII)$$

where each $R^6$ is independently hydrogen or lower alkyl, each $R^7$ is independently an alkyl, aryl, or arylalkyl group having 1 to 18 carbon atoms, each $R^8$ is an alkyl or alkyloxy chain having up to about 100 atoms in the chain, optionally substituted with Ar, U is $-O-$, $-S-$, $-N(R)-$, or $-P(L)_{1,2}-$, where R is as defined above, and where each L is independently $=O$, $=S$, $-OR$, or $-R$, and v ranges from 0 to 50; polycyclic alkenyl; or mixtures of any two or more thereof.

Particularly desirable maleimide compounds for use in the present invention include, for example, maleimides having the following structures:

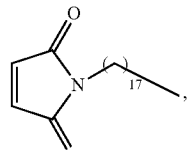
(XXIV)

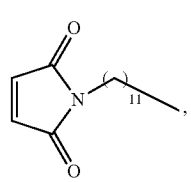
(XXV)

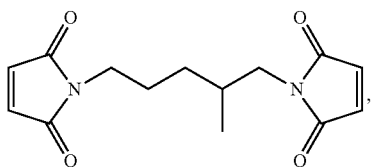

(XXVI)

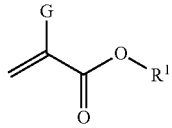

(XXVII)

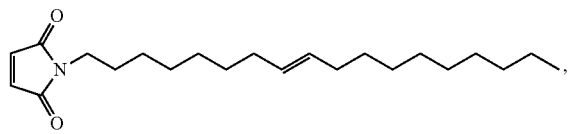

, and (XXVIII)

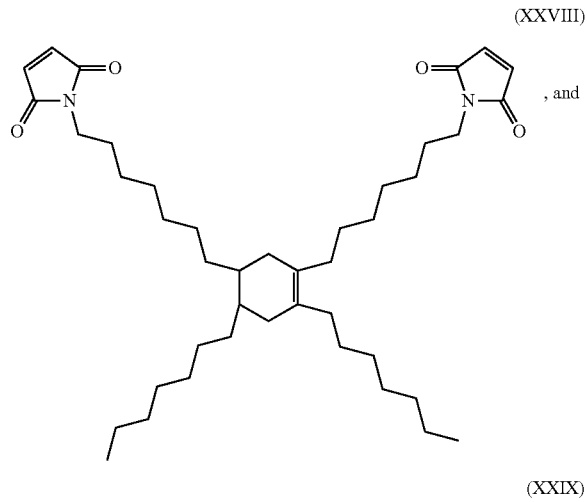

(XXIX)

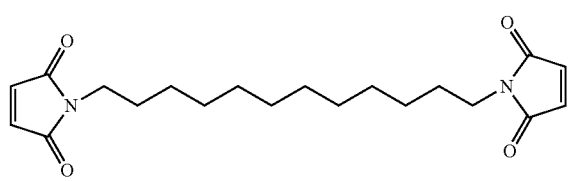

Preferred maleimide resins include stearyl maleimide, oleyl maleimide and behenyl maleimide, 1,20-bismaleimido-10,11-dioctyl-eicosane ("X-BMP"), and the like, as well as combinations thereof. Other maleimides suitable for use herein include those disclosed in U.S. Pat. No. 6,034,194 (Dershem) and U.S. Pat. No. 6,521,731 (Dershem), the disclosures of which are expressly incorporated herein by reference.

(Meth)acrylates useful as the curable resin may be chosen from a host of different compounds. As used herein, the terms (meth)acrylic and (meth)acrylate are used synonymously with regard to the monomer and monomer-containing component. The terms (meth)acrylic and (meth)acrylate include acrylic, (meth)acrylic, acrylate, and (meth)acrylate.

The (meth)acrylate component may comprise one or more members selected from a monomer represented by the formula:

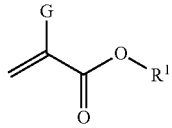

(XXX)

where G is hydrogen, halogen, or an alkyl having from 1 to 4 carbon atoms, $R^1$ has from 1 to 16 carbon atoms and is an alkyl, cycloalkyl, alkenyl, cycloalkenyl, alkaryl, aralkyl, or aryl group, optionally substituted or interrupted with silane, silicon, oxygen, halogen, carbonyl, hydroxyl, ester, carboxylic acid, urea, urethane, carbamate, amine, amide, sulfur, sulfonate, or sulfone; urethane acrylates or ureide acrylates represented by the formula:

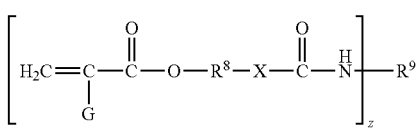

(XXXI)

where G is hydrogen, halogen, or an alkyl having from 1 to 4 carbon atoms, $R^8$ denotes a divalent aliphatic, cycloaliphatic, aromatic, or araliphatic group, bound through a carbon atom or carbon atoms thereof indicated at the —O— atom and —X— atom or group, X is —O—, —NH—, or —N(alkyl)-, in which the alkyl radical has from 1 to 8 carbon atoms, z is 2 to 6, and $R^9$ is a z-valent cycloaliphatic, aromatic, or araliphatic group bound through a carbon atom or carbon atoms thereof to the one or more NH groups; and a di- or tri(meth)acrylate selected from polyethylene glycol di(meth)acrylates, bisphenol-A di(meth)acrylates, tetrahydrofurane di(meth)acrylates, hexanediol di(meth)acrylate, trimethylol propane tri(meth)acrylate, or combinations thereof.

Suitable polymerizable (meth)acrylate monomers include triethylene glycol di(meth)acrylate, tripropylene glycol di(meth)acrylate, tetraethylene glycol di(meth)acrylate, diethylene glycol di(meth)acrylate, 1,4-butanediol di(meth)acrylate, 1,6-hexanediol di(meth)acrylate, pentaerythritol tetra(meth)acrylate, trimethylol propane tri(meth)acrylate, di-pentaerythritol monohydroxypenta(meth)acrylate, pentaerythritol tri(meth)acrylate, bisphenol-A-ethoxylate di(meth)acrylate, trimethylolpropane ethoxylate tri(meth)acrylate, trimethylolpropane propoxylate tri(meth)acrylate, and bisphenol-A-diepoxide di(meth)acrylate.

Additionally, mono-functional (meth)acrylate monomers may be used, including tetrahydrofurane (meth)acrylates and di(meth)acrylates, citronellyl (meth)acrylate, hydroxypropyl (meth)acrylate, tetrahydrodicyclopentadienyl (meth)acrylate, triethylene glycol (meth)acrylate, triethylene glycol (meth)acrylate, and combinations thereof.

Of course, (meth)acrylated silicones may also be used, provided the silicone backbone is not so large as to minimize the effect of (meth)acrylate when cure occurs.

Other (meth)acrylates suitable for use herein include the low viscosity acrylates disclosed in U.S. Pat. No. 6,211,320 (Dershem), the disclosure of which is expressly incorporated herein by reference.

The adhesive composition also includes a curing agent, such as a heat cure catalyst or a radiation cure photoinitiator. The curing agent should be included in the adhesive composition in an amount between 1 wt % and 30 wt % based on the total weight of the curable resin component.

The heat cure catalyst may be included in the composition to reduce the temperature at which cure occurs or hasten the degree of cure when the appropriate temperature condition is selected for cure to occur. The heat cure catalyst may be chosen from free radical catalysts, anionic curatives, cationic curatives, and combinations thereof. For instance, the free radical catalyst may be chosen from peroxides, azo compounds, and combinations thereof. Particularly desirable peroxide catalysts include dicumyl peroxide, dibenzoyl peroxide, 2-butanone peroxide, tert-butyl perbenzoate, di-tert-butyl peroxide, 2,5-bis(tert-butylperoxy)-2,5-dimethylhexane, bis(tert-butyl peroxyisopropyl)benzene, and tert-butyl hydroperoxide, and azo compounds include 2,2'-azobis(2-methylpropanenitrile), 2,2'-azobis(2-methylbutanenitrile), and 1,1'-azobis(cyclohexanecarbonitrile).

Commercially available examples of these free radical catalysts include those promoted by Akzo Nobel, such as the following peroxides di-isobutyryl peroxide (CAS No. 3437-84-1), cumyl peroxyneodecanoate (CAS No. 26748-47-0), peroxydicarbonate mixture (CAS No. 105-64-6; 19910-65-7; 78350-78-4), 2,4,2-trimethylpentyl-2 peroxyneodecanoate (CAS No. 51240-95-0), cumyl peroxyneoheptanoate (CAS No. 68299-16-1), di-sec-butyl peroxydicarbonate (CAS No. 19910-65-7), tert-butylperoxyneodecanoate (CAS No. 26748-41-4), dibutyl peroxydicarbonate (CAS No. 16215-49-9), dicetyl peroxydicarbonate (CAS No. 26332-14-5), di(4-tert-butylcyclohexyl) peroxydicarbonate (CAS No. 15520-11-3), di(2-ethylhexyl) peroxydicarbonate (CAS No. 16111-62-9), dimyristyl peroxydicarbonate (CAS No. 53220-22-7), tert-butyl peroxyneoheptanoate (CAS No. 26748-38-9), tert-amyl peroxypivalate (CAS No. 29240-17-3), tert-butyl peroxypivalate (CAS No. 927-07-1), di-(3,5,5-trimethylhexanoyl) peroxide (CAS No. 3851-87-4), dilauroyl peroxide (CAS No. 105-74-8), dioctanoyl peroxide (CAS No. 762-16-3), didecanoyl peroxide (CAS No. 762-12-9), 2,5-dimethyl-2,5-di(2-ethylhexanoylperoxy)hexane (CAS No. 13052-09-0), tert-amyl peroxy-2-ethylhexanoate (CAS No. 686-31-7), tert-butyl peroxy-2-ethylhexanoate (CAS No. 3006-82-4), dibenzoyl peroxide (CAS No. 94-36-0), 1,1-di(tert-butylperoxy)-3,3,5-trimethyleyelohexane (CAS No. 6731-36-8), 2,2-bis[4,4-di-(tertbutyl-peroxy-cyclohexyl) propane] (CAS No. 1705-60-8), 1,1-di(tert-amylperoxy)cyclohexane (CAS No. 15667-10-4), 1,1-di(tert-butylperoxy) cyclohexane (CAS No. 3006-86-8), tert-amyl peroxy 2-ethylhexyl carbonate (CAS No. 70833-40-8), tert-butyl peroxy-3,5,5-trimethylhexanoate (CAS No. 13122-18-4), tert-butyl peroxy-2-methylbenzoate (CAS No. 22313-62-8) 2,2-di-(tert-butylperoxy)butane (CAS No. 2167-23-9), tert-butyl peroxy isopropyl carbonate (CAS No. 2372-21-6), tert-butyl peroxy 2-ethylhexyl carbonate (CAS No. 34443-12-4), tert-amyl peroxybenzoate (CAS No. 4511-39-1), tert-butyl peroxyacetate (CAS No. 107-71-1), butyl 4,4-di-(tert-butylperoxy)valerate (CAS No. 995-33-5), tert-butyl peroxybenzoate (CAS No. 614-45-9), di-tert-amyl peroxide (CAS No. 10508-09-5), dicumyl peroxide (CAS No. 80-43-3), di-(tert-butylperoxyisopropyl)benzene (CAS No. 25155-25-3), 2,5-dimethyl-2,5-di(tert-butylperoxy)hexane (CAS No. 78-63-7), tert-butyl cumyl peroxide (CAS No. 3457-61-2), 2,5-dimethyl-2,5-di(tertbutylperoxy)hexyne-3 (CAS No. 1068-27-5), di-tert-butyl peroxide (CAS No. 110-05-4), 3,6,9-triethyl-3,6,9-trimethyl-1,4,7-triperoxonane (CAS No. 24748-23-0), 1,1,3,3-tetramethylbutyl hydroperoxide (CAS No. 5809-08-5), diisopropylbenzene monohydroperoxide (CAS No. 26762-93-6), cumyl hydroperoxide (CAS No. 80-15-9), tert-butyl hydroperoxide (CAS No. 75-91-2), and tert-amyl hydroperoxide (CAS No. 3425-61-4), and the following azo compounds 2,2'-azobis(isobutyronitrile) (CAS No. 78-67-1), 2,2'-azobis(2-methylbutyronitrile) (CAS No. 13472-08-7), and 1,1'azobis(1-cyclohexanenitrile) (CAS No. 2094-98-6).

The heat cure catalyst may also be an anionic curative, such as those broadly described as aza compounds, amine compounds, amide compounds, imidazole compounds, and combinations thereof. More specific examples of aza compounds include:

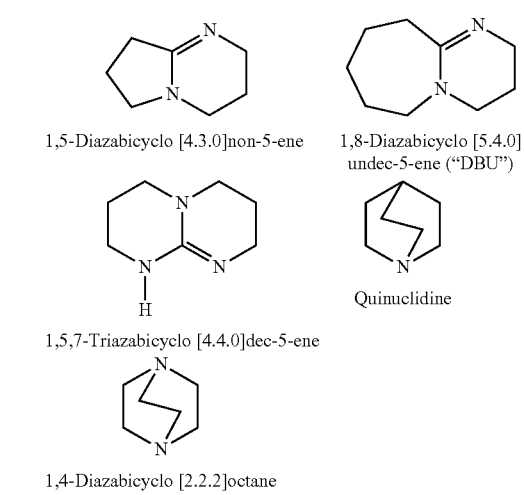

1,5-Diazabicyclo [4.3.0]non-5-ene 1,8-Diazabicyclo [5.4.0] undec-5-ene ("DBU")

Quinuclidine 1,5,7-Triazabicyclo [4.4.0]dec-5-ene 1,4-Diazabicyclo [2.2.2]octane More specific examples of amine compounds include aliphatic polyamines, aromatic polyamines, alicyclic polyamines, such as diethylenetriamine, triethylenetetraamine, diethylaminopropylamine, benzyl dimethylamine, m-xylenediamine, diaminodiphenylamine, quinoxaline, isophoronediamine, menthenediamine and combinations thereof.

A more specific example of an amide compound is the functionalized amide, dicyandiamide.

More specific examples of imidazole compounds include isoimidazole, imidazole, 2-ethyl-4-methylimidazole, 2,4-dimethylimidazole, butylimidazole, 2-heptadecenyl-4-methylimidazole, 2-methylimidazole, 2-undecenylimidazole, 1-vinyl-2-methylimidazole, 2-undecylimidazole, 2-heptadecylimidazole, 2-phenylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole, addition products of an imidazole and methylimidazole, addition products of an imidazole and trimellitic acid, 2-n-heptadecyl-4-methylimidazole, phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole-, 1-benzyl-2-methylimidazole, 2-p-methoxystyrylimidazole, and combinations thereof.

The heat cure catalyst may also be a cationic curative, such as those broadly described as organic acids, anhydrides, and Lewis acids. The organic acids include phenols, thiophenols, thiols, carboxylic acids, and combinations thereof. The anhydrides include among others hexahydrophthalic anhydride, methyl hexahydrophthalic anhydride, 5-(2,5-dioxotetrahydrol)-3-methyl-3-cyclohexene-1,2-dicarboxylic anhydride, and combinations thereof. The Lewis acids include a variety of materials known in the art as Lewis acids, examples of which are phosphines, alkyl halides, phosphorous esters, boron trifluoride etherate, and the like.

In the event that it is desirable for certain commercial applications to cure the adhesive composition by exposure to radiation in the electromagnetic spectrum, a photoinitiator should also be included in the composition. The photoinitiator should be chosen with an eye toward the range of radiation in the electromagnetic spectrum at which cure is to be triggered. For instance, suitable ranges of radiation in the electromagnetic spectrum include UV, UV/VIS, VIS, IR, E-beam, X-ray, and microwave radiation.

Representative examples of UV and UV/VIS photoinitiators include those available commercially from Ciba Specialty Chemicals, Tarrytown, N.Y. under the "IRGACURE" and "DAROCUR" tradenames, specifically "IRGACURE" 184 (1-hydroxycyclohexyl phenyl ketone), 907 (2-methyl-1-[4-(methylthio)phenyl]-2-morpholino propan-1-one), 369 (2-benzyl-2-N,N-dimethylamino-1-(4-morpholinophenyl)-1-butanone), 500 (the combination of 1-hydroxy cyclohexyl phenyl ketone and benzophenone), 651 (2,2-dimethoxy-2-phenyl acetophenone), 1700 (the combination of bis(2,6-dimethoxybenzoyl-2,4,4-trimethyl pentyl) phosphine oxide and 2-hydroxy-2-methyl-1-phenyl-propan-1-one), and 819 [bis(2,4,6-trimethyl benzoyl) phenyl phosphine oxide] and "DAROCUR" 1173 (2-hydroxy-2-methyl-1-phenyl-1-propane) and 4265 (the combination of 2,4,6-trimethylbenzoyl-diphenyl-phosphine oxide and 2-hydroxy-2-methyl-1-phenyl-propan-1-one); and the visible light [blue] photoinitiators, dl-camphorquinone and "IRGACURE" 784DC. Of course, combinations of these materials may also be employed herein.

Other photoinitiators useful herein include alkyl pyruvates, such as methyl, ethyl, propyl, and butyl pyruvates, and aryl pyruvates, such as phenyl, benzyl, and appropriately substituted derivatives thereof.

Photoinitiators particularly well-suited for use herein include ultraviolet photoinitiators, such as 2,2-dimethoxy-2-phenyl acetophenone (e.g., "IRGACURE" 651), and 2-hydroxy-2-methyl-1-phenyl-1-propane (e.g., "DAROCUR" 1173), bis(2,4,6-trimethyl benzoyl) phenyl phosphine oxide (e.g., "IRGACURE" 819), and the ultraviolet/visible photoinitiator combination of bis(2,6-dimethoxybenzoyl-2,4,4-trimethylpentyl) phosphine oxide and 2-hydroxy-2-methyl-1-phenyl-propan-1-one (e.g., "IRGACURE" 1700), as well as the visible photoinitiator bis ([5-2,4-cyclopentadien-1-yl)-bis [2,6-difluoro-3-(1H-pyrrol-1-yl)phenyl]titanium (e.g., "IRGACURE"784DC).

Additional photoinitiators may be chosen from those available from Sartomer, Inc., Exton, Pa. under the tradenames "ESACURE" and "SARCAT". Examples include "ESACURE" KB1 (benzil dimethyl ketal), "ESACURE" EB3 (mixture of benzoin and butyl ethers), "ESACURE" TZT (trimethylbenzophenone blend), "ESACURE" KIP100F (hydroxy ketone), "ESACURE" KIP150 (polymeric hydroxy ketone), "ESACURE" KT37 (blend of "ESACURE" TZT and KIP150), "ESACURE" KT046 (blend of triphenyl phosphine oxide, "ESACURE" KIP150 and TZT), and "ESACURE" X33 [blend of 2- and 4-isopropylthioxanthone, ethyl 4-(dimethyl amino) benzoate and "ESACURE" TZT].

Of course, combinations of such photoinitiators may be used as deemed appropriate by those of ordinary skill in the art.

In addition, the photoinitiator may be a cationic one, which is capable of catalyzing the polymerization of the inventive compositions upon exposure to appropriate radiation conditions. Desirable cationic photoinitiators for use with the present invention include triarylsulfonium and diaryliodonium salts containing non-nucleophilic counterions and aryl diazonium salts, examples of which include 4-methoxybenzenediazonium hexafluorophosphate, benzenediazonium tetrafluoroborate, diphenyl iodonium chloride, diphenyl iodonium hexafluorophosphate, 4,4-dioctyloxydiphenyl iodonium hexafluorophosphate, triphenylsulfonium tetrafluoroborate, diphenyltolylsulfonium hexafluorophosphate, phenylditolylsulfonium hexafluoroarsenate, and diphenyl-thiophenoxyphenylsulfonium hexafluoroantimonate, and those commercially available from Sartomer, such as "SARCAT" CD 1010 [triaryl sulfonium hexafluoroantimonate (50% in propylene carbonate)], "SARCAT" DC 1011 [triaryl sulfonium hexafluorophosphate (50% n-propylene carbonate)], "SARCAT" DC 1012 (diaryl iodonium hexafluoroantimonate), and "SARCAT" K185 [triaryl sulfonium hexafluorophosphate (50% in propylene carbonate)].

The adhesive composition of the present invention also includes a block copolymer additive, which aids in the transfer of the adhesive composition from a hydrophobic substrate to a hydrophilic substrate.

Block copolymer additives of the instant invention include those block copolymers which comprise both hydrophobic and hydrophilic segments or portions, of the general formula:

$$—[(R^1)_v—(R^2)_w]_n— \quad (XXXII)$$

where each $R^1$ is independently a hydrophobic olefin, such as ethylene, propylene, 1-butene, 1-hexene, 3-methyl-1-pentene, or 4-methyl-1-pentene or a polymerizable hydrophobic aromatic hydrocarbon such as styrene; each $R^2$ is a hydrophilic acid anhydride, such as maleic anhydride; v ranges from 1 to 12; w is from 1 to 6; and n is from 1 to 50.

Incorporating into the adhesive composition of the present invention such an additive having the unique structure shown in XXXII causes the adhesive composition to have a greater affinity towards a polar, hydrophilic substrate than towards a hydrophobic substrate, which is generally nonpolar. Such effect is derived from the hydrophilic moiety within the additive molecule that is typically charge-polarized and capable of entering into a charged interaction with another substrate, substance, or macromolecule in which polar groups dominate. As will become more clear by reference to the discussion of the Figures and Examples that follow, this interaction becomes especially important during the die pickup stage of the die attach process where it is desirable for the adhesive layer to be attracted to a semiconductor wafer, the most commonly used of which are hydrophilic, so as to limit the necessary processing steps.

Preferably, the glass transition temperature ("$T_g$") of the block copolymer additive used in the adhesive composition will be above about 40° C. In one embodiment, the $T_g$ of the block copolymer additive is between about 40° C. and about 155° C.

The $T_g$ of a polymer is the temperature at which the polymer becomes brittle on cooling or soft on heating. More specifically, it defines a pseudo second order phase transition in which a polymer yields, on cooling, a glassy structure with properties similar to those of a crystalline material. Above $T_g$, the polymer becomes soft and capable of plastic deformation without fracture. While the $T_g$ is occasionally described as the "softening temperature" of a polymer, it is not uncommon for the polymer to begin softening at a temperature below the $T_g$. This is because, due to the nature of many non-crystalline polymers, the softening of the polymer may occur over a temperature range rather than abruptly at a single temperature value. $T_g$ generally refers to the middle point of this range even though the polymer may begin to soften at a different temperature. For purposes of this application, the $T_g$ of a polymer refers to the value as determined by ASTM E-1356.

In addition to becoming brittle at temperatures below $T_g$, a polymer also generally become drier and less tacky than when that same polymer is heated to a temperature above its $T_g$. A tacky polymer will more readily adhere to a surface upon application of pressure alone than a non-tacky polymer. The importance of incorporating a copolymer additive that has a $T_g$ above 40° C., and thus is dry or only slightly tacky at this point, will become more apparent by the discussion that follows.

In one embodiment, the block copolymer additive is a styrene maleic anhydride copolymer, represented by the formula:

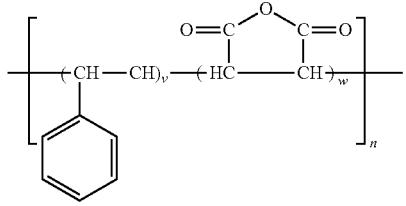

(XXXIII)

where v, w, and n are as defined above.

Styrene maleic anhydride copolymers are well known in the art and are available from Sartomer Company, Inc. of Exton, Pa. under the trade name SMA® EF80, for example. Styrene maleic anhydride copolymers represent the copolymerization product of styrene and maleic anhydride and are characterized by alternating blocks of styrene and maleic anhydride moieties. In this particular embodiment of the additive, the styrene moieties represent the hydrophobic segments and the maleic anhydride moieties represent the hydrophilic segments.

The ratio of the hydrophobic moieties to the hydrophilic moieties in the block copolymer additive of the present invention is generally from 2:1 (hydrophobic:hydrophilic) to 12:1 (hydrophobic:hydrophilic), such as 6:1 to 8:1.

The block copolymer additive may be incorporated into the adhesive composition in an amount up to about 50 wt %, desirably from 5 to 40 wt % based on the total weight of the adhesive composition.

The adhesive composition may further include in the range of about 10 up to 90 wt % filler, based on the total weight of the composition. Fillers contemplated for use in the practice of the present invention may optionally be conductive (electrically and/or thermally). Electrically conductive fillers contemplated for use in the practice of the present invention include, for example, silver, nickel, gold, cobalt, copper, aluminum, graphite, silver-coated graphite, nickel-coated graphite, alloys of such metals, and the like, as well as mixtures thereof. Both powder and flake forms of filler may be used herein. In flake form, the filler may have a thickness of less than about 2 microns, with planar dimensions of about 20 to about 25 microns. Flake employed herein may have a surface area of about 0.15 to 5.0 $m^2/g$ and a tap density of about 0.4 up to about 5.5 g/cc. In powder form, the filler particles may have a diameter of about 0.5 to 30 microns, such as about 20 microns.

Thermally conductive fillers contemplated for use herein include, for example, aluminum nitride, boron nitride, silicon carbide, diamond, graphite, beryllium oxide, magnesia, silica, alumina, and the like.

Electrically and/or thermally conductive fillers should be rendered substantially free of catalytically active metal ions by treatment with chelating agents, reducing agents, nonionic lubricating agents, or mixtures of such agents. Such treatment is described in U.S. Pat. No. 5,447,988 (Dershem), which is expressly incorporated by reference herein in its entirety.

Optionally, a filler may be used that is neither electrically nor thermally conductive. Such fillers may be desirable to impart some other property to the formulation such as, for example, reduced thermal expansion of the cured composition, reduced dielectric constant, improved toughness, viscosity, and the like. Examples of such fillers include perfluorinated hydrocarbon polymers (i.e., TEFLON), thermoplastic polymers, thermoplastic elastomers, mica, fused silica, glass powder, spacer elements, polymethyl (meth)acrylate powder, polyamide powder, polymethylsilsesquioxane powder, and the like.

Examples of suitable elastomers that can be added to the adhesive composition include acrylic rubbers, butadiene/acrylonitrile rubber, styrene/butadiene rubber, buna rubber, polyisobutylene, polyisoprene, natural rubber, polyurethane, ethylene-vinyl acetate polymers, ethylene acrylate rubbers, fluorinated rubbers, isoprene-acrylonitrile polymers, chlorosulfonated polyethylenes, and homopolymers of polyvinyl acetate. These elastomers are preferably added before the adhesive composition undergoes cure.

The adhesive composition may further contain other additives, such as defoaming agents, leveling agents, dyes, and pigments.

Solvents may also be incorporated into the adhesive composition or used during the preparation thereof. Suitable solvents are anhydrous organic solvents, such as acetone, 2-butanone, ethyl acetate, butyl acetate, tetrahydrofuran, dioxan, benzene, toluene, xylene, ethylbenzene, chlorobenzene, dichlorobenzene, dimethylformamide, dimethyl acetamide, or N-methylpyrrolidone. In particular, acetone, 2-butanone, tetrahydrofuran, ethyl acetate, or chlorobenzene are useful.

Figure 2:
FIG. 2 is a schematic representation of a dicing die attach film that may be used in forming an assembly.
Figure 3:
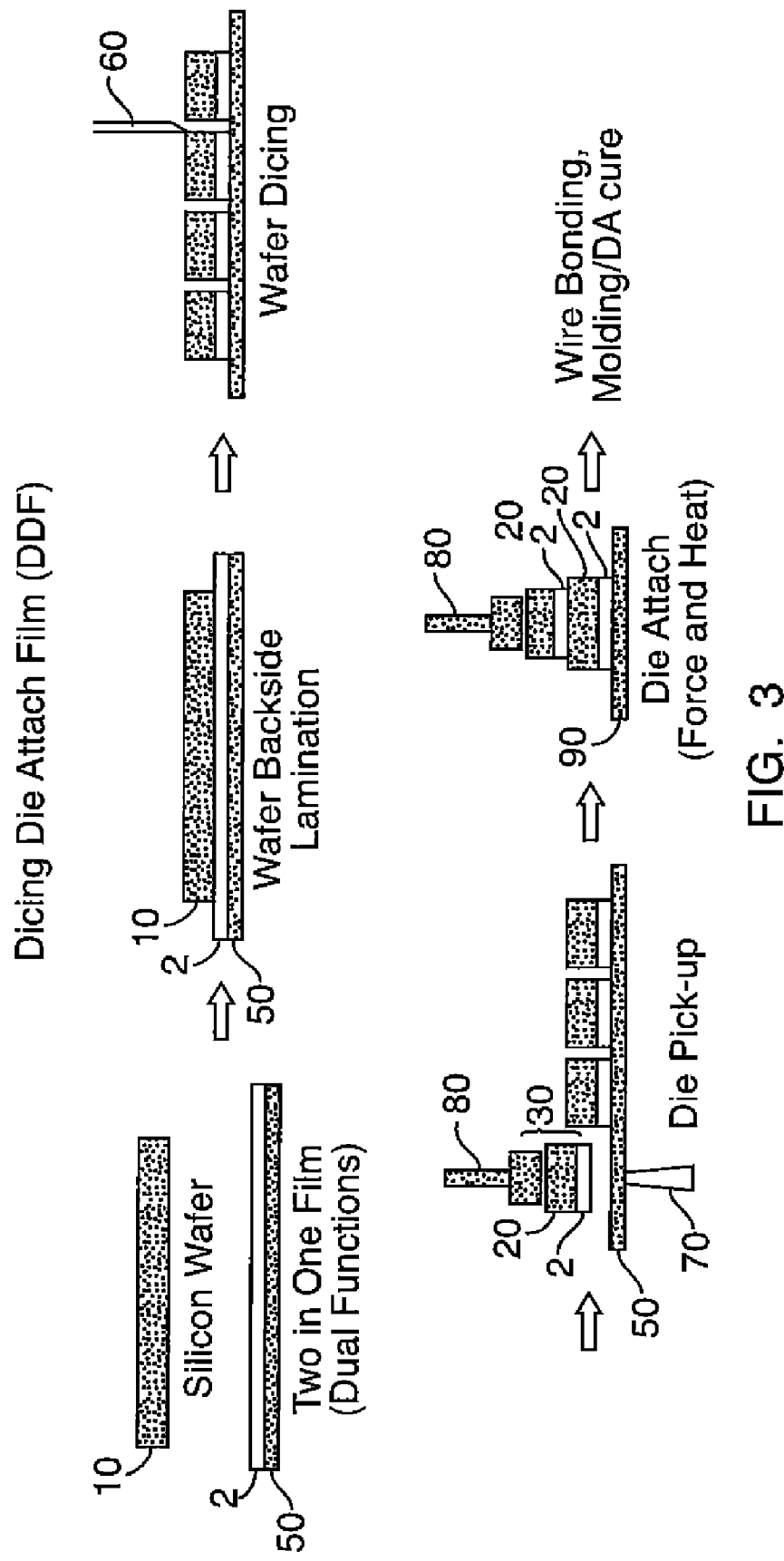
FIG. 3 is a schematic representation of one embodiment of the method of forming the assembly using the dicing die attach film of FIG. 2.
Figure 4:
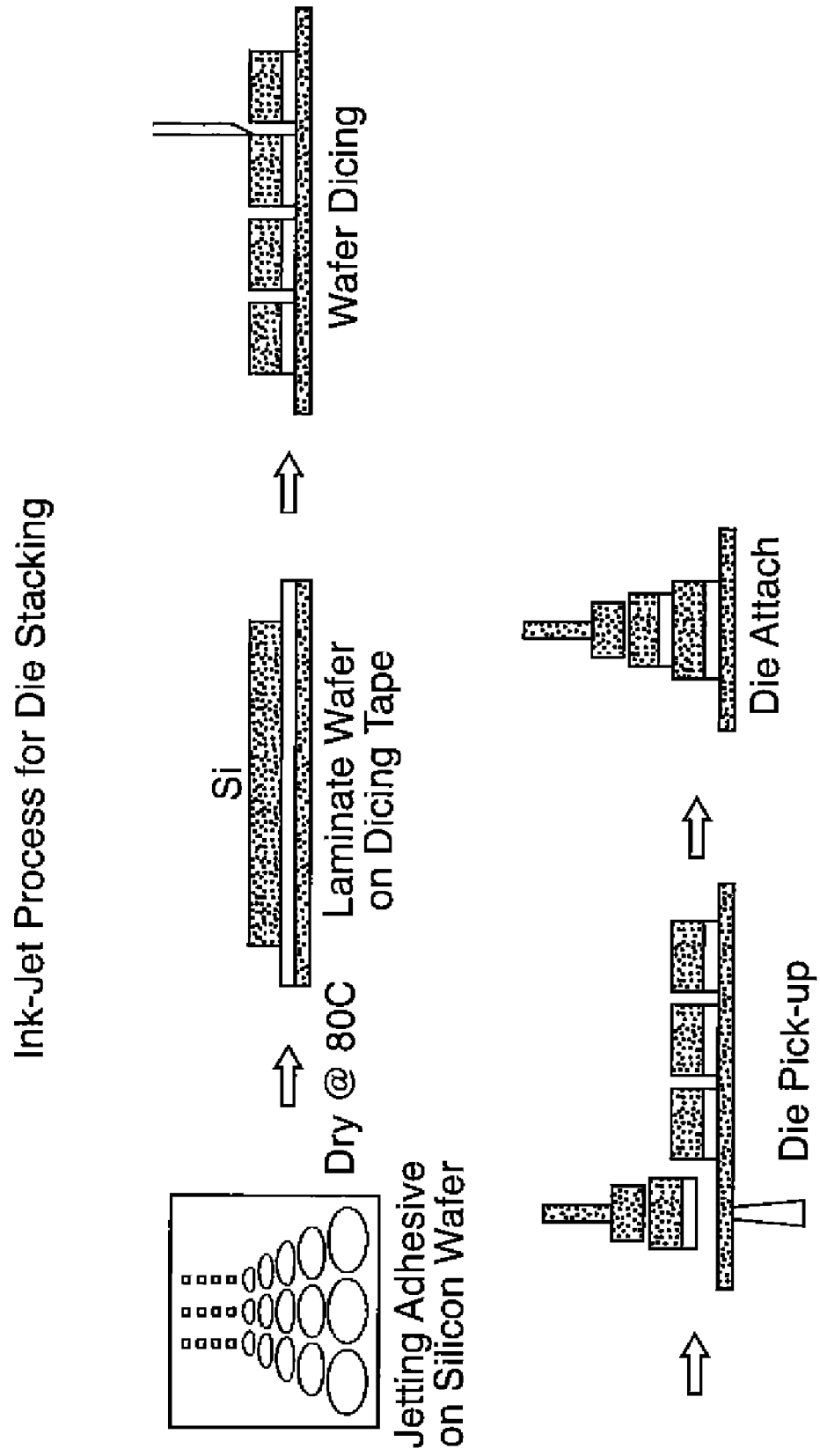
FIG. 4 is a schematic representation of another embodiment of the method of forming the assembly using an ink jet printing application.

Referring to the drawings in which like reference characters refer to like parts throughout the several views thereof, an assembly 30 is depicted in FIGS. 1 and 2. Depicted in FIGS. 3 and 4 are methods of forming an assembly 30.

Generally speaking, assembly 30 includes a semiconductor chip die 20 and a layer of adhesive composition 2, which may be partially cured.

Chip die 20 is produced by dicing, or segmenting by sawing, a wafer into smaller segments or pieces. These individual segments of the wafer are what are known as the chip dies 20. Chip die 20 may be constructed of any material known in the art. For example, chip die 20 may be constructed of silicon, germanium, or the like, but the most common is silicon. Chip die 20 may also be coated with a passivation material which is capable of inhibiting environmental corrosion. The coating of chip die 20 may be accomplished before or after the dicing of the wafer into the individual dies 20.

Chip die 20 includes opposing first and second surfaces, including chip surface 22 as a first surface and attach surface 24 as a second surface. On attach surface 24 is disposed adhesive layer 2.

Adhesive layer 2 can be applied directly to attach surface 24. This direct application can be accomplished by any method known in the art, including ink jet printing, stencil printing, screen printing, or spray coating. The method of application should uniformly coat the attach surface 24. Such direct application of adhesive layer 2 to attach surface 24 can be accomplished before or after the dicing process. Adhesives which are applied directly to the chip die are known in the art as "pre-applied" adhesives.

Once the adhesive layer 2 is applied directly to attach surface 24, the adhesive layer 2 can be partially cured or B-staged. Conditions suitable for curing the adhesive layer 2 include subjecting the adhesive layer 2 to a temperature of at least about 100° C., but less than about 300° C., for about 15 up to about 70 minutes.

Alternatively, adhesive layer 2 can first be applied to an intermediate substrate 50, such as a wafer dicing tape or film or a wafer supporting tape or film. An example of such a substrate 50 with the adhesive layer 2 applied thereto is shown in FIG. 2.

In one embodiment, the intermediate substrate 50 is a polyolefin film, examples of which include polyethylene, polyvinyl chloride, polybutene, polybutadiene, polyurethane, polyester, polyamide, and copolymers thereof. The polyolefin film may optionally be a laminate of several films. While there are no particular limitations concerning the thickness of the polyolefin film, it is usually about 10 to 300 μm, such as about 50 to 200 μm.

The adhesive layer 2 is applied to the surface of the polyolefin film using any applicable method, including rolling, spray printing, or the like. If the adhesive composition forming the adhesive layer 2 contains a high amount of solvent, the adhesive layer 2 and the polyolefin film are subjected to a B-staging process, which removes the excess solvent from the adhesive composition without significantly advancing cure of the resins. A typical B-staging time may be from about 1 to about 10 minutes at a temperature of between about 70 and 90° C. The length of the B-staging may vary depending on the amount of solvent present in the adhesive composition and also on the temperature selected. Once this process is complete, the adhesive layer 2 will be film-like in texture. The adhesive layer 2 can then be laminated to the surface of the intermediate substrate 50 under conventional laminating conditions. Similar products, which combine a polyolefin tape with an adhesive layer disposed thereon, are known in the industry as 2-in-1 tape, examples of which include Hysol® QMI 5100/5200 available commercially from Henkel.

Referring now to FIG. 3, a method of forming the assembly 30 will be described. Adhesive layer 2 is applied to intermediate substrate 50 to form a 2-in-1 tape product as described above. Next, a pre-diced wafer 10 is placed onto adhesive layer 2 and a backside lamination process affixes the pre-diced wafer 10 to the substrate 50 with the adhesive layer 2 creating an interface between the backside of the wafer and the intermediate substrate 50. Conditions suitable for the backside lamination process include subjecting the adhesive layer 2 to a temperature of between about 32 and about 100° C., such as between 50 and 60° C., and applying mild pressure to the top of the wafer. During lamination, the adhesive layer 2 softens and wets the surface of the pre-diced wafer 10 generating enough adhesiveness between the pre-diced wafer 10 and the intermediate substrate 50 to hold the pre-diced wafer 10 in place relative to the intermediate substrate 50 during subsequent processing of the wafer. The adhesive composition does not undergo complete cure during the backside lamination process but partial cure may occur.

Next, the pre-diced wafer 10 undergoes a dicing process. During wafer dicing, the dicing saw 60 or, optionally, saws (not shown), cuts completely through the wafer 10 and the adhesive layer 2. As mentioned above, the adhesive layer 2 provides sufficient adhesion strength to hold the pre-diced wafer 10 in place relative to the intermediate substrate 50 during the dicing process. The dicing process segments the wafer into a plurality of individual chip dies 20 and to the backside of each chip die 20 is a correspondingly segmented portion of the adhesive layer 2.

After dicing is complete, the chip dies 20, are removed from the intermediate substrate 50 by a process known as die pickup or die pick-and-place. Die pickup is generally accomplished through the use of pick and place equipment and usually involves first loosening the individual dies 20 from the intermediate substrate 50 and then lifting the dies 20 with a pickup tool 80 using, for example, suction. Die pickup may be carried out at any temperature, but a temperature near or above room temperature is most common.

A die 20 can be loosened from the intermediate substrate 50 in various ways. For one, as shown in FIG. 3, the die 20 can be loosened from the intermediate substrate 50 by applying pressure from underneath the die 20 through the use of an ejector tool 70. The ejector tool 70 may be comprised of, for example, a single pin-like element or may be comprised of a set of pin-like elements. Alternatively, the die 20 can be loosened from the intermediate substrate 50 by applying radiation to the adhesive layer 2 sufficient to cure the adhesive. Once cured, the adhesive force of the adhesive becomes weaker, making it easier to remove the die 20 using a die pickup tool 80. For example, if the adhesive composition includes a photoinitiator making it susceptible to cure upon exposure to radiation in the UV range, application of UV radiation to the adhesive layer 2 will cause the adhesive to cure, thus weakening its adhesiveness to the dicing tape.

Desirably, the segment of adhesive layer 2 on the backside of each of the chip dies 20 will transfer from the intermediate substrate 50 to the die 20 during die pickup and thus remain on the backside of the die 20 after pickup is complete. Such an effect will make the subsequent placement of the die 20 much simpler since the transferred adhesive layer 2 can act as the adhesive necessary to bond the die at another location, foregoing the need of the additional step of dispensing a new amount of adhesive to bond the die 20 at its new location.

If during die pickup the adhesive layer 2 is tacky, it is much more unlikely that it will cleanly transfer to the backside of the die 20. Instead, a tacky adhesive layer, or at least a portion thereof, will remain adhered or stuck to the surface of the intermediate substrate 50 during die pickup. As explained previously, the adhesive composition will be drier and less tacky if it is in a solid, crystalline-like state. Because the die pickup process is usually conducted at room temperature (taken as 32° C.), it is preferential that the adhesive composition achieve a solid-like state at this temperature. The adhesive composition described herein achieves such a property because the adhesive is in a relatively crystalline state at temperatures below about 40° C. Thus, if die pickup is performed at room temperature, the adhesive layer 2 will be substantially non-tacky.

After removing the die 20 from the intermediate substrate 50, the die 20 can be placed on another substrate, such as a circuit board 90, during die placement or stacked onto another die 20 to create a stacked die assembly (such as described in U.S. Pat. Nos. 5,140,404, 5,286,679, 5,323,060, and 6,465,893, the disclosures of each of which being hereby expressly incorporated herein by reference). Optionally, the surface onto which the die 20 will be placed is heated prior to receiving the die 20 so that when the adhesive layer 2, which is attached to the backside of the die 2, contacts the heated surface, the adhesive softens and wets the placement surface. Sometime after placement of the die 20, the adhesive layer 2 is cured by, for example, subjecting it to a temperature of between about 130 and 180° C. for a period of between about 30 and 90 minutes.

FIG. 4 represents another method of preparing the assembly 30. In FIG. 4, an ink jet printer is used to apply an adhesive layer 2 directly onto a pre-diced wafer 10. This process is known in the industry as ink jetting or ink jet printing. During ink jet printing, the adhesive composition is loaded into a cartridge in a ink jet printer, such as a those manufactured by FUJIFILM Dimatix®, Inc., a pre-diced wafer 10 is fed through the printer, and the printer dispenses the adhesive onto the surface of the pre-diced wafer 10. The adhesives used for ink jetting have a much lower viscosity than those adhesives used for other application methods, such as the ones discussed above involving stencil printing or 2-in-1 tapes. For example, the viscosity of an adhesive suitable for use in ink jetting is typically between 1 and 20 cps, such as 2 to 10 cps.

pressure to the top of the wafer. During lamination, the adhesive layer 2 softens and wets the surface of the intermediate substrate 50 generating enough adhesiveness between the pre-diced wafer 10 and the intermediate substrate 50 to hold the pre-diced wafer 10 in place relative to the intermediate substrate 50 during subsequent processing of the wafer. The adhesive composition does not undergo complete cure during the backside lamination process but partial cure may occur.

Dicing, die pickup, and die placement can then proceed in a manner similar to that described above with respect to the method of FIG. 3.

The present invention will be more readily appreciated with reference to the examples which follow.

EXAMPLES

Figure 5:
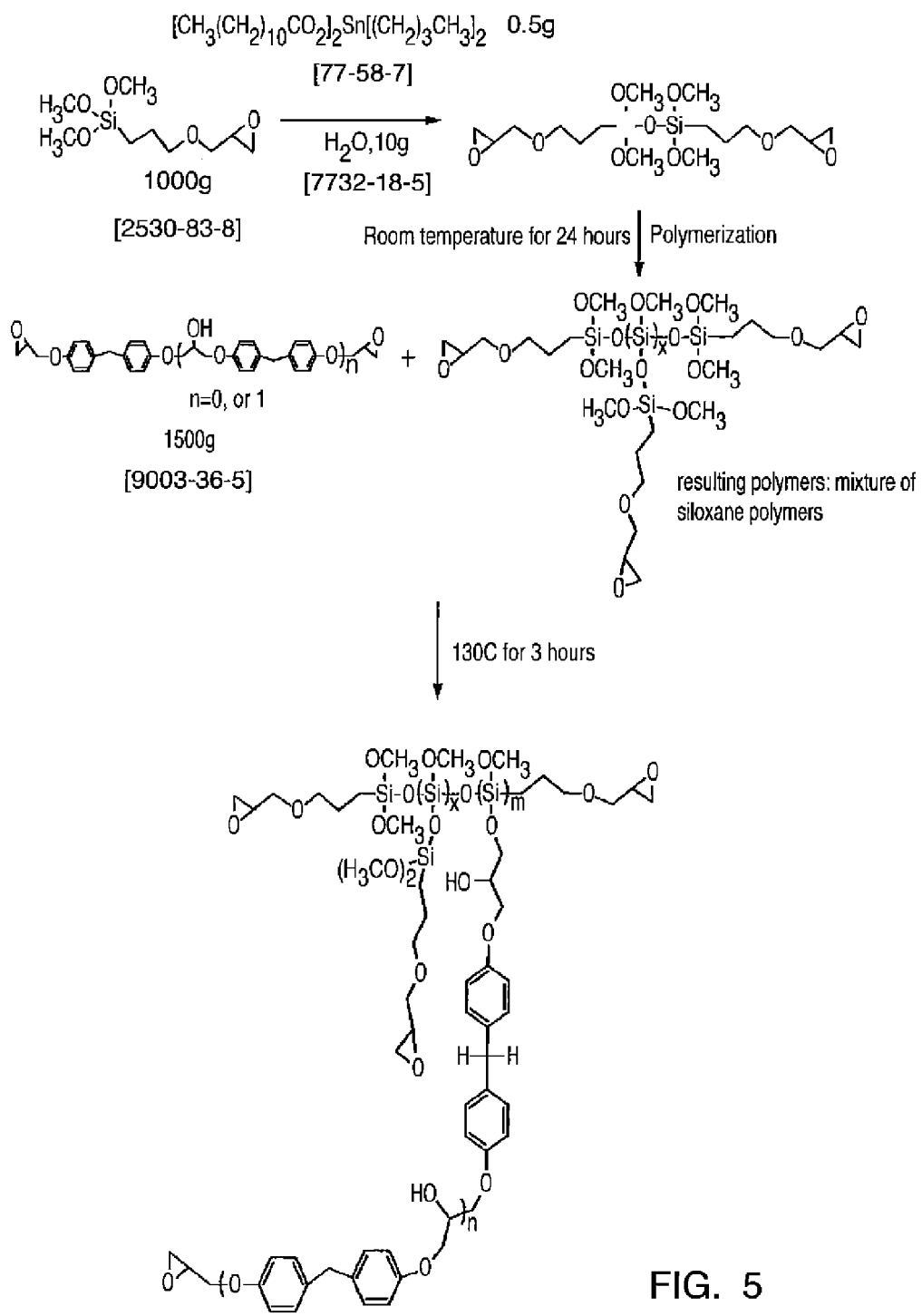
FIG. 5 depicts a synthetic scheme by which the silane modified epoxy discussed herein may be prepared.

Adhesive compositions were prepared according to the formulations recited below in Tables 1 and 2. The silane modified epoxy was made in accordance with the synthetic scheme set forth in FIG. 5.

TABLE 1

| Component | Sample | | | | | | | | | | | | | | | |
|---|---|---|---|---|---|---|---|---|---|---|---|---|---|---|---|---|
| | A | B | C | D | E | F | G | H | I | J | K | L | M | N | O | P |
| silane modified epoxy | 48.5 | 34 | 24.2 | 21.8 | 19.4 | 16 | 13.4 | 11.9 | 7.5 | 5.7 | 18.5 | 17.4 | 16.4 | 18.5 | 14.2 | 18.5 |
| thermoplastic polyurethane[1] | 13.2 | 9.2 | 6.6 | 5.9 | 5.3 | 4.4 | 3.6 | 3.3 | 2.1 | 1.6 | 5.0 | 4.7 | 4.4 | 5.0 | 3.8 | 5.0 |
| Bisphenol F epoxy | 26.3 | 18.4 | 13.2 | 11.8 | 10.5 | 8.7 | 7.3 | 6.5 | 4 | 3.1 | 10.0 | 9.4 | 8.9 | 10.0 | 7.7 | 10.0 |
| Diaminodiphenyl sulfone | 12 | 8.4 | 6 | 5.5 | 4.8 | 8.9 | 3.4 | 2.9 | 1.8 | 3.2 | 4.7 | 4.4 | 4.1 | 4.7 | 3.6 | 4.7 |
| styrene maleic copolymer[2] | 0 | 0 | 15 | 20 | 25 | 20 | 12.3 | 15.4 | 9.6 | 7.1 | 17 | 16 | 15 | 17 | 13 | 17 |
| 2-Butanone | 0 | 30 | 35 | 35 | 35 | 30 | 60 | 60 | 75 | 75 | 29.8 | 28.0 | 26.3 | 29.8 | 22.8 | 29.8 |
| DCPD Epoxy[3] | 0 | 0 | 0 | 0 | 0 | 12 | 0 | 0 | 0 | 4.3 | 0 | 0 | 0 | 0 | 0 | 0 |
| polymethysilsesquioxane powder[4] | 0 | 0 | 0 | 0 | 0 | 0 | 0 | 0 | 0 | 0 | 15 | 20 | 25 | 0 | 0 | 0 |
| PMMA powder[5] | 0 | 0 | 0 | 0 | 0 | 0 | 0 | 0 | 0 | 0 | 0 | 0 | 0 | 15 | 0 | 0 |
| Silica | 0 | 0 | 0 | 0 | 0 | 0 | 0 | 0 | 0 | 0 | 0 | 0 | 0 | 0 | 35 | 0 |
| Polyamide powder[6] | 0 | 0 | 0 | 0 | 0 | 0 | 0 | 0 | 0 | 0 | 0 | 0 | 0 | 0 | 0 | 15 |

[1]Estagrip ST80A from Noveon, Cleveland, OH
[2]SMA EF80 from Sartomer
[3]Tactix 556 from Huntsman Chemical
[4]Tospearl 120 from GE Silicones
[5]Tex Matte from Shamrock Technology, Newark, NJ
[6]Orgasol powder from Arkema, Philadelphia, PA In order to achieve such low viscosities, it is usually necessary to include a high percentage of solvent material in adhesives used for ink jetting.

After the ink jet printer has applied an adhesive layer 2 onto a pre-diced wafer 10, the wafer 10 undergoes a drying process in order to rid the adhesive composition of much of the solvent. Removal of the solvent increases the viscosity of the adhesive layer 2 and the resultant adhesive layer 2 becomes more film-like in consistency. A typical drying time may be about 1-10 minutes at a temperature of about 80° C. The length of drying time may vary depending on the amount of solvent present in the adhesive composition and also on the temperature selected for the drying process.

Subsequent to the drying process, the pre-diced wafer 10 with adhesive layer 2 applied thereto is placed onto an intermediate substrate 50, such as those described above, and undergoes backside lamination to adhere the pre-diced wafer 10 relative to the intermediate substrate 50. Conditions suitable for the backside lamination process include subjecting the adhesive layer 2 to a temperature of between 32° C. and 100° C., such as between 50° C. and 60° C., and applying mild

TABLE 2

| | Sample | | |
|---|---|---|---|
| Component | Q | R | S |
| Acrylic Polymer[1] | 11.47 | 5.7 | |
| styrene maleic copolymer[2] | 0 | 5.7 | 20.6 |
| Solid acrylic monomer[3] | 2.3 | 2.3 | |
| Liquid epoxy acrylate[4] | 9.2 | 9.2 | |
| Peroxide[5] | 0.23 | 0.23 | |
| Defoamer[6] | 0.13 | 0.13 | |
| Silane-modified epoxy | 0.1 | 0.1 | |
| SO-E2 Silica | 2.25 | 2.25 | |
| 2-Butanone | 74.4 | 74.4 | 36.2 |
| Bismaleimide[7] | | | 10 |
| Silane-modified epoxy | | | 2.3 |
| DCPD Epoxy[8] | | | 19.1 |
| Diaminodiphenyl sulfone | | | 4.9 |

TABLE 2-continued

| | Sample | | |
|---|---|---|---|
| Component | Q | R | S |
| Ethylene acrylate rubber[9] | | | 5.9 |
| Organic peroxide | | | 1 |

[1]M6003 BMA polymer from Negami Chemical
[2]SMA EF80 from Sartomer
[3]SR633 from Sartomer
[4]Ebecryl3600 from Cytec
[5]Dicumyl peroxide from Aldrich
[6]PC 1344 defoamer from Monsanto
[7]X-BMI Resin from Henkel
[8]Tactix 556 from Huntsman Chemical
[9]VAMAC G from DuPont Samples A and B were prepared by adding silane-modified epoxy and thermoplastic urethane in a glass mixer heated by an oil bath at a temperature of 120° C. and mixing until both the epoxy and the urethane were in complete solution. Next, diaminodiphenyl sulfone was added and the mixture was mixed until the diaminodiphenyl sulfone was completely dissolved. The mixture was then cooled to 25° C., and the butanone was added, and the mixture was mixed for an additional 30 minutes.

Samples C-P, which each contains an amount of styrene maleic anhydride as a block copolymer additive, were prepared by dissolving the styrene maleic anhydride in 2-butanone at a temperature of 25° C. and separately combining the other components using the same procedure as discussed above with respect to Samples A and B. The styrene maleic anhydride solution was then added to the epoxy solution and the resulting mixture was mixed at a temperature of 25° C. for a period of time of 30 minutes.

Sample Q was prepared by adding the acrylic monomer, acrylic polymer, epoxy acrylate, and silane-modified epoxy in a glass mixer heated by an oil bath at a temperature of 120° C. and mixing until the components were in complete solution. Next, the peroxide was added and the mixture was mixed until the peroxide was completely dissolved. The mixture was then cooled to a temperature of 25° C., the rest of the components were added, and the mixture was mixed for an additional 30 minutes.

Sample R was prepared in a manner similar to Sample Q but the styrene maleic anhydride was first dissolved in 2-butanone at a temperature of 25° C. and then added to the solution which contained the other components and mixed at 25° C. for 30 minutes.

Sample S was prepared by dissolving the styrene maleic anhydride in 2-butanone at a temperature of 25° C. to form a styrene maleic anhydride solution. Separately, the bismaleimide, silane-modified epoxy, and DCPD epoxy were placed in a glass mixer heated by an oil bath at 120° C. and mixed until all were in complete solution. Next, the diaminodiphenyl sulfone and peroxide were added and the mixture was mixed until the diaminodiphenyl sulphone and peroxide were completely dissolved. The mixture was then cooled to a temperature of 25° C., the rest of the components were added, and the mixture was mixed for an additional 30 minutes. The styrene maleic anhydride solution was then added and the resulting mixture was mixed at a temperature of 25° C. for 30 minutes.

The sample adhesive compositions were evaluated for various properties and the results of these evaluations are displayed in Table 3.

TABLE 3

| | | | | Property | | | |
|---|---|---|---|---|---|---|---|
| Sample | Adhesive Type[1] | Viscosity (cps) | B-Stage Conditions (° C./min.) | Film Characteristic after B-Stage | Film Melting Point After B Stage (° C.) | Film thickness after release (μm) | Si Wafer-Film Laminating Temp. (° C.) |
| A | PAA | 15000 | 150/60 | Tacky | 80 | 50-100 | 50-60 |
| B | DDF | 200 | 150/60 | Tacky | 80 | 50-100 | 50-60 |
| C | DDF | 240 | 80/5 | Less tacky | 80 | 50-100 | 50-60 |
| D | DDF | 280 | 80/5 | Slightly tacky | 80 | 50-100 | 50-60 |
| E | DDF | 460 | 80/5 | Dry | 80 | 50-100 | 50-60 |
| F | DDF | 340 | 80/5 | Slightly tacky | 80 | 50-100 | 50-60 |
| G | Ink Jet | 8 | 80/5 | Slightly tacky | 80 | 5 | 50-60 |
| H | Ink Jet | 9 | 80/5 | Dry | 80 | 5 | 50-60 |
| I | Ink Jet | 3 | 80/5 | Slightly tacky | 80 | 5 | 50-60 |
| J | Ink Jet | 5 | 80/5 | Slightly tacky | 80 | 5 | 50-60 |
| K | DDF | 450 | | | | | |
| L | DDF | 620 | | | | | |
| M | DDF | 780 | | | | | |
| N | DDF | 400 | | | | | |
| O | DDF | 690 | | | | | |
| P | DDF | 900 | | | | | |
| Q | | | | Tacky | | | |
| R | | | | Not tacky | | | |
| S | DDF | 800 | 80/5 | Slightly tacky | 80 | 50-100 | 50-60 |
| QMI 5100[2] | DDF | | | Dry | 130 | 75 | 60 |

| | Property | | | | | |
|---|---|---|---|---|---|---|
| Sample | % Adhesive Transferred to Si die during pickup | Die Attach Temp. (° C.) | % Voids in Die Attach bond after placement | Modulus @ room temp. (Gpa) | $T_g$ (° C.) After Cure | Adhesive Strength @ 245° C. (N/m$^2$) |
| A | 0% | | NA | 2.3 | 84 | 2.4 × E6 |
| B | 0% | | NA | 2.3 | 84 | 2.4 × E6 |
| C | 0% | | NA | 2 | 77 | 2.0 × E6 |
| D | 100% | 80 | 0% | 2.2 | 80 | 2.0 × E6 |

TABLE 3-continued

| | | | | | | | |
|---|---|---|---|---|---|---|---|
| E | 100% | 80 | 0% | 2.4 | 85 | 2.2 × E6 | |
| F | 100% | 80 | 0% | 3.5 | 130 | 2.5 × E6 | |
| G | 100% | 80 | 0% | 2.2 | 80 | 2.0 × E6 | |
| H | 100% | 80 | 0% | 2.4 | 85 | 2.2 × E6 | |
| I | 100% | 80 | 0% | 2.4 | 80 | 2.2 × E6 | |
| J | 100% | 80 | 0% | 3.5 | 130 | 2.5 × E6 | |
| K | 100% | | 0% | | | | |
| L | 100% | | less than 5% | | | | |
| M | 100% | | less than 5% | | | | |
| N | 100% | | less than 5% | | | | |
| O | 100% | | 20% | | | | |
| P | 100% | | 15% | | | | |
| Q | 0% | | NA | | | | |
| R | OK | | OK | | | | |
| S | 100% | 80 | 0% | 1.2 | 30 | 1.0 × E6 | |
| QMI 5100[2] | 100% | 120 | 30% | | | | |

[1]PAA = pre applied adhesive; DDF = dicing die attach film; Ink Jet = ink jet printing applied adhesive
[2]Hysol ® 5100/5200 dicing die attach film available commercially from Henkel During each of the tests in Table 3, the pre-diced wafer used was a silicon 3 mil. polished wafer having a size of 250×300 mil This wafer represents a hydrophilic substrate.

Sample A, which had a high viscosity due to the absence of solvent, was applied directly to a pre-diced wafer using stencil printing and was then B-staged at 150° C. for 60 minutes. Because no solvent was present, the volume of the adhesive layer remained constant throughout B-staging. After B-staging was complete, the adhesive layer had a dome-like shape and a tacky texture. The pre-diced wafer, with the adhesive layer applied thereto, was then placed onto a polyolefin dicing tape with the adhesive layer forming an interface between the wafer and the tape. Backside lamination by a Ultron® UH114-8 wafer laminator operating at a wafer laminating temperature of 65° C. (actual temperature on wafer top) and mild pressure applied by manual rolling secured the wafer to the dicing tape. The wafer and the adhesive layer were then diced with a DISCO® DAD 3350 dicing machine operating with the following parameters:
  35,000 rpm
  20 mm/sec.
  1st cut: Blade 27H EFF, Cut Depth 50 μm into Si Die
  2nd cut: Blade 27H EBB, Cut Depth 30 μm into Dicing Tape
  Water Jet: 1.3 L/min.

After dicing was complete, the individual chip dies were picked up using a Datacon® 2200apm+Multi-Chip Die Bonder operating with the following parameters:
  Needle: Four Round Ejector Pins
  Pickup Tool: Flat
  Ejection Speed: 15 mm/sec.
  Needle End Point: 1.0 mm
  Pickup Time: 0.1 sec.

After the pickup process, the amount of the adhesive that remained on the backside of the individual chip dies was visually evaluated. It was observed that 0% of the adhesive layer remained affixed to the chip die after die pickup. Because the chip die could not undergo subsequent die placement without first dispensing an additional amount of adhesive either on the die or on the placement surface, the die attach properties of Sample A were not evaluated.

Samples B-F were each applied as a thin layer directly onto a polyolefin dicing tape in order to create a 2-in-1 dicing die attach film (DDF). B-staging at 80° C. for 5 minutes removed most of the solvent from the adhesive leaving a film-like layer of adhesive ranging from tacky for the sample that did not contain any styrene maleic anhydride block copolymer additive (Sample B) to dry for the sample that contained 25 wt % styrene maleic anhydride block copolymer additive (Sample E) in texture. The adhesive layer was laminated to the dicing tape at a temperature of 55° C. and mild pressure using a GBC® HeatSeal™ HP600 laminator.

A pre-diced silicon wafer was then placed onto the adhesive layer and backside lamination using the Ultron® UH114-8 wafer laminator described above secured the wafer relative to the tape surface. The wafer was diced with a DISCO® DAD 3350 under the same dicing parameters as above.

After dicing, the individual chip dies were picked up using a Datacon® 2200apm+Multi-Chip Die Bonder operating under the same parameters as above. After pickup, the amount of adhesive that transferred from the dicing tape to the chip die was evaluated by visually examining the die and its footprint left on the dicing tape to determine if any residual adhesive remained on the dicing tape and was thus not transferred to the die. The adhesive of Sample B, which did not contain any styrene maleic anhydride copolymer additive, exhibited 0% transfer to the chip die during pickup. The same result was observed for the adhesive of Sample C, which contained 15 wt % styrene maleic anhydride copolymer. However, the adhesives of Samples D-F, which contained 20 wt %, 25 wt %, and 20 wt % styrene maleic anhydride copolymer, respectively, each exhibited 100% transfer of the adhesive layer from the dicing tape to the individual chip dies during die pickup.

The individual chip dies of Samples D-F underwent die placement onto a substrate using the Datacon® 2200apm+ Multi-Chip Die Bonder. Die placement was conducted at 80° C. and 0.5 kg pressure for 1 second. After die placement was complete, the adhesive composition was cured at 165° C. for 60 minutes to secure the chip die to the substrate. After completion of the die placement process, acoustic microscopy image analysis was conducted to determine the coverage area of the adhesive at the bond interface between the chip die and the substrate. Full adhesive coverage, meaning few to no voids exist in the bond interface layer across the bottom surface area of the chip die, is preferential because it generally creates a stronger bond between the chip die and the substrate and also better thermal and/or electrical conductivity across the interface. Samples D, E, and F each exhibited full adhesive coverage.

Samples G-J were prepared for application in an ink jet printing operation. The viscosity of each of these sample adhesives was much lower than in the pre-applied adhesive and dicing die attach film applications of Samples A-F. This low viscosity was the result of a high amount of solvent added to the adhesive composition. After preparation, these adhesives were loaded into a Dimatix® materials printer and ink jetted directly onto the surface of a pre-diced silicon wafer. Because the ink jet type adhesives have a high amount of solvent, the adhesive layer was dried at 80° C. for 5 minutes after application onto the wafer surface in order to form a thin, film-like adhesive layer. The resulting layer ranged from slightly tacky to dry, as noted in Table 3. The pre-diced wafer was then applied to a polyolefin dicing tape, laminated, and diced according to the procedures discussed above, except that now the adhesive layer is on the pre-diced wafer rather than the tape surface. Subsequent to the dicing process, the chip dies underwent die pickup and placement onto a substrate in a manner similar to that described above.

With each of Samples G-J, the adhesive layer remained on the surface of the die after die pickup and no residual adhesive remained on the surface of the dicing tape. In addition, each of Samples G-J exhibited complete bond coverage after die placement with no observable voids in the bond interface.

Because of the high solvent percentage in Samples G-J, complete release of the adhesive layer was observed even when the amount of styrene maleic anhydride copolymer in the adhesive was relatively low. For example, Sample C contained 15 wt % styrene maleic anhydride copolymer but complete release of the adhesive layer was not observed while Sample J, which contained only 7.1 wt % styrene maleic anhydride copolymer, demonstrating complete release of the adhesive layer to the chip die, suggesting that the amount of additive required to act as a release agent may be dependent upon the viscosity of the composition.

Samples K-P show the effect of adding various filler materials to the adhesive compositions of the present invention used in the dicing die attach application. The filler materials affected the viscosity of the adhesive compositions. In each of these Samples, the adhesive layer was completely transferred to the chip die surface during die pickup. After placement of the die, the percentage of voids in the bond interface ranged from 0% in Sample K to 20% in Sample O.

In Samples Q and R, the curable resin component included acrylic monomer. Sample Q did not include any styrene maleic anhydride block copolymer additive while Sample R included 25 wt % styrene maleic anhydride. The adhesive composition of Sample Q was tacky in texture while the adhesive film of Sample R, which contained styrene maleic anhydride as the block copolymer additive, was not tacky. After die pickup was completed, it was observed that the adhesive of Sample Q did not release from the dicing film. The adhesive of Sample R, however, exhibited satisfactory release from the dicing film during die pickup. In addition, after die placement, it was observed that the adhesive of Sample R provided adequate coverage across the die attach bond with few to no voids present.

In Sample S, the curable resin component of the adhesive included bismaleimide, and more specifically X-BMI, a proprietary bismaleimide compound available from Henkel. This adhesive was tested for use in a dicing die attach film application in a manner similar to Samples C-F. The adhesive composition of Sample S was only slightly tacky in texture. After die pickup, it was observed that the adhesive of Sample S experienced complete release from the dicing tape to the die surface. In addition, no voids were observed along the bond interface after die placement.

QMI 5100 is a commercially available dicing die attach film product from Henkel. QMI 5100 is comprised of a pressure sensitive adhesive layer on expandable polyolefin dicing tape. As shown in Table 3, complete adhesive transfer from the dicing tape to the chip die during die pickup was achieved using QMI 5100. However, after the die placement process is complete, up to 30% voids were observed in the bond interface. QMI 5100 and other currently available dicing die attach film products include a high molecular weight resin which is necessary to achieve adequate release during die pickup. However, these high molecular weight resins do not flow as freely during die placement, which may result in an incomplete die attach bond interface. The adhesives of the instant invention, meanwhile, allow complete adhesive film transfer to be coupled with a low-void bond interface after die placement since the block copolymer additive aids in the release of the adhesive film, even if it comprised of lower molecular weight resins.

What is claimed is:
1. An adhesive composition, comprising:
an epoxy resin component, at least a portion of which comprises a silane-modified epoxy resin;
a curing agent; and
a block copolymer additive comprising hydrophobic segments and hydrophilic segments,
wherein the glass transition temperature of the block copolymer additive is between about 40° C. and 155° C.
2. The adhesive composition of claim 1, wherein the ratio of the hydrophobic segments to the hydrophilic segments in the block copolymer additive is at least 2:1.
3. The adhesive composition of claim 1, wherein the ratio of the hydrophobic segments to the hydrophilic segments in the block copolymer additive is between 3:1 and 12:1.
4. The adhesive composition of claim 1, wherein the hydrophilic segments comprise an anhydride.
5. The adhesive composition of claim 1, wherein the hydrophilic segments comprise maleic anhydride.
6. The adhesive composition of claim 1, wherein the hydrophobic segments comprise at least one of the group consisting of: ethylene, propylene, 1-butene, 1-hexene, 3-methyl-1-pentene, 4-methyl-1-pentene, or styrene.
7. The adhesive composition of claim 1, wherein the hydrophobic segments comprise styrene.
8. The adhesive composition of claim 1, wherein the hydrophilic segments comprise maleic anhydride and the hydrophobic segments comprise styrene.
9. The adhesive composition of claim 8, wherein the ratio of the hydrophobic segments to the hydrophilic segments is between 3:1 and 12:1.
10. The adhesive composition of claim 1, further comprising a member selected from the group consisting of episulfides, maleimides, itaconimides, nadimides, (meth)acrylates, and combinations thereof.

* * * * *